United States Patent
Yang et al.

(10) Patent No.: US 9,324,972 B2
(45) Date of Patent: Apr. 26, 2016

(54) ORGANIC LIGHT EMITTING DISPLAY DEVICE

(71) Applicant: LG Display Co., Ltd., Seoul (KR)

(72) Inventors: Hee Seok Yang, Ansan-si (KR); Jong Kyun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/509,883

(22) Filed: Oct. 8, 2014

(65) Prior Publication Data

US 2015/0137093 A1 May 21, 2015

(30) Foreign Application Priority Data

Nov. 19, 2013 (KR) .......................... 10-2013-0140756

(51) Int. Cl.
*H01L 27/32* (2006.01)
*H01L 51/52* (2006.01)

(52) U.S. Cl.
CPC .......... *H01L 51/5284* (2013.01); *H01L 27/326* (2013.01); *H01L 27/3244* (2013.01); *H01L 27/3276* (2013.01); *H01L 51/5281* (2013.01)

(58) Field of Classification Search
CPC ............ H01L 27/3244; H01L 27/3276; H01L 51/5281; H01L 51/5284
See application file for complete search history.

(56) References Cited

U.S. PATENT DOCUMENTS

| | | | |
|---|---|---|---|
| 5,342,681 A * | 8/1994 | Sulzbach | C23C 14/0617 428/307.3 |
| 2003/0116765 A1* | 6/2003 | Koo et al. | 257/59 |
| 2004/0141127 A1* | 7/2004 | Tsai et al. | 349/137 |
| 2005/0006652 A1* | 1/2005 | Pai | 257/79 |
| 2007/0128528 A1* | 6/2007 | Hess | B82Y 10/00 430/5 |
| 2010/0140649 A1* | 6/2010 | Kim | H01L 51/5206 257/98 |
| 2010/0328756 A1* | 12/2010 | Miyashita et al. | 359/296 |
| 2013/0249383 A1* | 9/2013 | Yoo et al. | 313/504 |
| 2013/0299883 A1* | 11/2013 | Lin et al. | 257/288 |
| 2014/0042396 A1* | 2/2014 | Yang et al. | 257/40 |
| 2014/0054554 A1* | 2/2014 | Lee et al. | 257/40 |
| 2015/0028294 A1* | 1/2015 | Kim | H01L 27/322 257/40 |

FOREIGN PATENT DOCUMENTS

JP 2010250005 A * 11/2010

OTHER PUBLICATIONS

English machine translation of JP2010-250005A to Oikawa et al.*

* cited by examiner

*Primary Examiner* — Eduardo A Rodela
*Assistant Examiner* — Christopher M Roland
(74) *Attorney, Agent, or Firm* — Fenwick & West LLP

(57) ABSTRACT

An organic light emitting display device comprises a substrate that includes a plurality of pixel regions; a conductive line arranged on the substrate; and an anti-reflective layer arranged on the conductive line, wherein the anti-reflective layer includes an intermediate layer arranged on the conductive line and a semi-transparent layer arranged on the intermediate layer, and the conductive line is electrically connected with the semi-transparent layer.

9 Claims, 5 Drawing Sheets

ORGANIC LIGHT EMITTING DISPLAY DEVICE

CROSS REFERENCE TO RELATED APPLICATIONS

This application claims the benefit of the Korean Patent Application No. 10-2013-0140756 filed on Nov. 19, 2013, which is hereby incorporated by reference for all purposes as if fully set forth herein.

BACKGROUND

1. Technical Field

The present disclosure relates to an organic light emitting display device, and more particularly, to an active organic light emitting display device.

2. Discussion of the Related Art

Recently, with the development of information society, lightweight and thin flat panel displays have been actively developed. Examples of such flat panel displays include liquid crystal displays and organic light emitting display devices. Since the organic light emitting display device does not require a separate light source such as a backlight used in the liquid crystal display and has excellent color reproduction, the organic light emitting display device realizes thinner and clearer picture quality.

Among such organic light emitting display devices, an active organic light emitting display device generally includes unit pixels comprising three sub-pixels for each of red, green, and blue light. Each sub-pixel is defined by a crossing between a gate line and a data line, and is driven independently by a driving circuit that includes a separate thin film transistor (TFT).

Various conductive lines including a thin film transistor are arranged in the driving circuit of the sub-pixel. The conductive lines include a gate line, a data line and a power line are arranged in the periphery of the sub-pixel. The gate line, the data line and the power line respectively supply a gate signal, a data signal and a power signal, which are required for driving the sub-pixel. If the conductive lines reflect external light, external visibility is deteriorated.

In order to prevent such reflection of external light from occurring, a polarizing plate may be used. If the polarizing plate is used, 45% or less of the light emitted from the organic light emitting device is transmitted through the polarizing plate, resulting in a luminance reduction of 50% or more. But, if driving power is increased to compensate for the reduced luminance, then the lifespan of the organic light emitting layer gets reduced.

Particularly, in case of a transparent organic light emitting display device that has recently received much attention as a display for the next generation, a transparent area is arranged such that light from a rear background may be transmitted to the front of the display device. This results in a degradation of external visibility and contrast ratio.

Moreover, in transparent organic light emitting display devices, since a polarizing plate is often eliminated for improved light transmittance of the transparent area, an alternative solution for improving external visibility and contrast ratio is required.

SUMMARY

Accordingly, the present disclosure is directed to an organic light emitting display device that substantially obviates one or more problems due to limitations and disadvantages of the related art.

An advantage of the present embodiments is to provide an organic light emitting display device that may improve visibility and contrast by reducing reflection of external light from a surface of the organic light emitting display device. In one or more embodiments, this reduction in the reflection of external light may be achieved by using an anti-reflective surface on one or more portions of the display device, while eliminating a polarizing plate.

Additional advantages and features of the embodiments will be set forth in part in the description which follows and in part will become apparent to those having ordinary skill in the art upon examination of the following or may be learned from practice of the disclosure. The objectives and other advantages of the embodiments may be realized and attained by the structure particularly pointed out in the written description and claims hereof as well as the appended drawings.

To achieve these objects and other advantages and in accordance with the purpose of the disclosure, as embodied and broadly described herein, an organic light emitting display device according to one aspect of the present disclosure comprises a substrate that includes a plurality of pixel regions; a conductive line arranged on the substrate; and an anti-reflective layer arranged on the conductive line, wherein the anti-reflective layer includes an intermediate layer arranged on the conductive line and a semi-transparent layer arranged on the intermediate layer, and the conductive line is electrically connected with the semi-transparent layer.

It is to be understood that both the foregoing general description and the following detailed description of the present disclosure are exemplary and explanatory and are intended to provide further explanation of the embodiments as claimed.

BRIEF DESCRIPTION OF THE DRAWINGS

The accompanying drawings, which are included to provide a further understanding of the embodiments and are incorporated in and constitute a part of this application, illustrate embodiment(s) of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Figure 1:
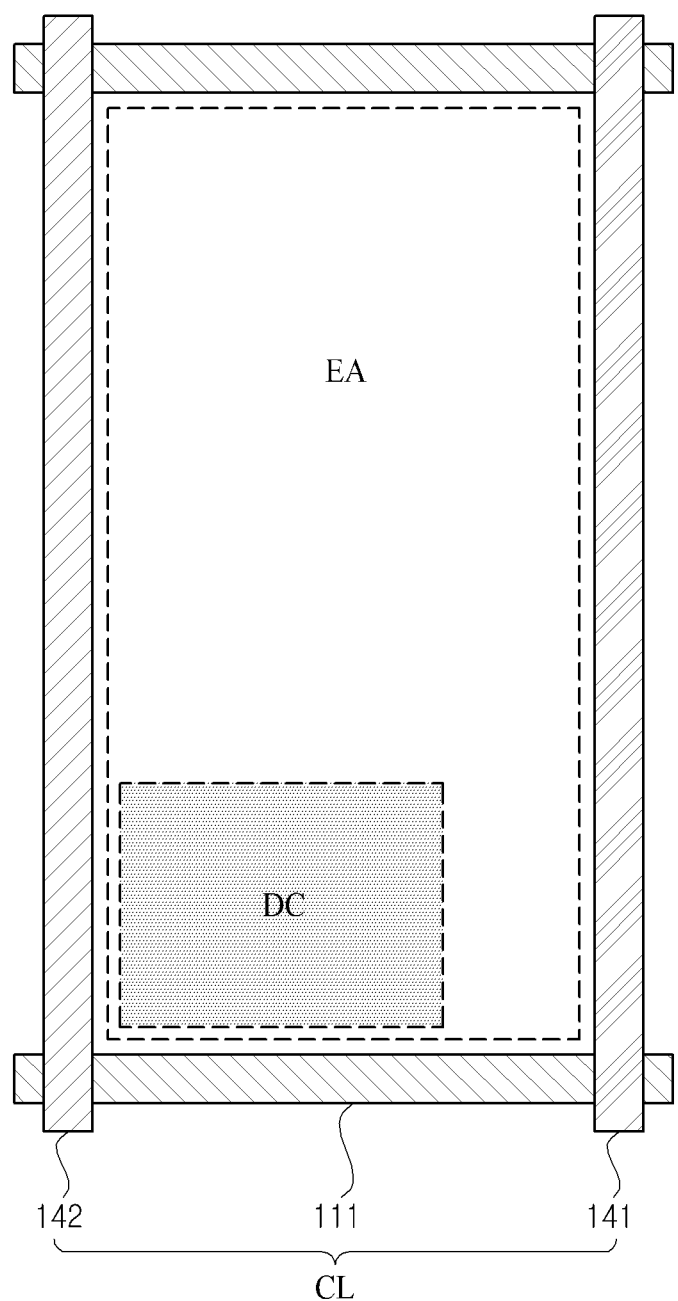
FIG. 1 is a plane view illustrating one pixel of an organic light emitting display device according to one embodiment of the present disclosure.

FIG. 1 is a plane view illustrating one pixel of an organic light emitting display device according to one embodiment of the present disclosure, and illustrates a conductive line CL, which defines a pixel, without separately illustrating an anti-reflective layer 120 arranged on the conductive line CL. An illustration of an anti-reflective layer 120 arranged on the conductive line CL is provided instead in the cross-sectional views of FIGS. 3-5.

As shown in FIG. 1, the organic light emitting display device according to one embodiment of the present disclosure includes the conductive line CL required for driving. The conductive line CL includes a gate line 111, a data line 141 and a power line 142. The gate line 111 and the data line 141 define a pixel by crossing each other. The data line 141 and the power line 142 may be arranged at a pixel boundary per pixel, or may be arranged at the pixel boundary alternately per pixel.

Figure 5:
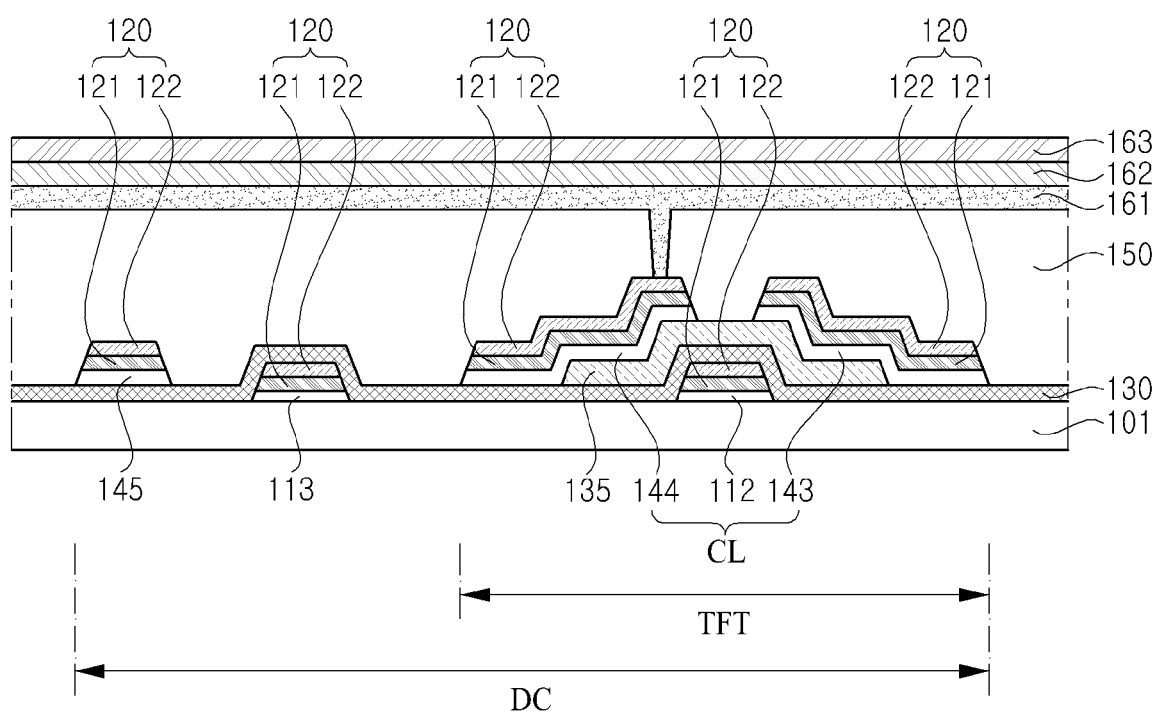
FIG. 5 is a cross-sectional view illustrating an organic light emitting display device according to one embodiment of the present disclosure.

The organic light emitting display device shown in FIG. 1 is a general top emission type organic light emitting display device. Accordingly, a light-emitting area EA may be arranged all over the pixel. A driving circuit DC is formed in an area overlapped with the light-emitting area EA in a direction opposite to a light-emitting direction, thereby maximizing the light emitted from the light-emitting area EA. Although the driving circuit DC is covered with the light-emitting area EA, while a user is watching the display device, since a plurality of conductive portions 113 and 145 for driving are concentrated on the driving circuit DC, much reflection may occur. The conductive portions 113 and 145 are shown in FIG. 5.

The conductive portions 113 and 145 which are elements required for the driving circuit DC may include a capacitor connected with the conductive line CL, and a thin film transistor, and a connection line that connects a plurality of elements including the capacitor and the thin film transistor with each other.

Since the conductive line CL that includes the conductive portions 113 and 145 is generally formed of a material having high reflectivity, for example, metal, the anti-reflective layer 120 may be arranged on the conductive line CL and the conductive portions 113 and 145 to prevent reflection from occurring. Since reflection of external light is intended to improve visibility and contrast ratio, the anti-reflective layer 120 may be arranged in a watching direction of the user. In other words, in case of a bottom emission type, the anti-reflective layer 120 may be arranged between the conductive line CL and a substrate 101 (shown in the cross-sectional views of FIGS. 3-5). In case of the top emission type, the anti-reflective layer 120 may be arranged on the conductive line CL.

Figure 2:
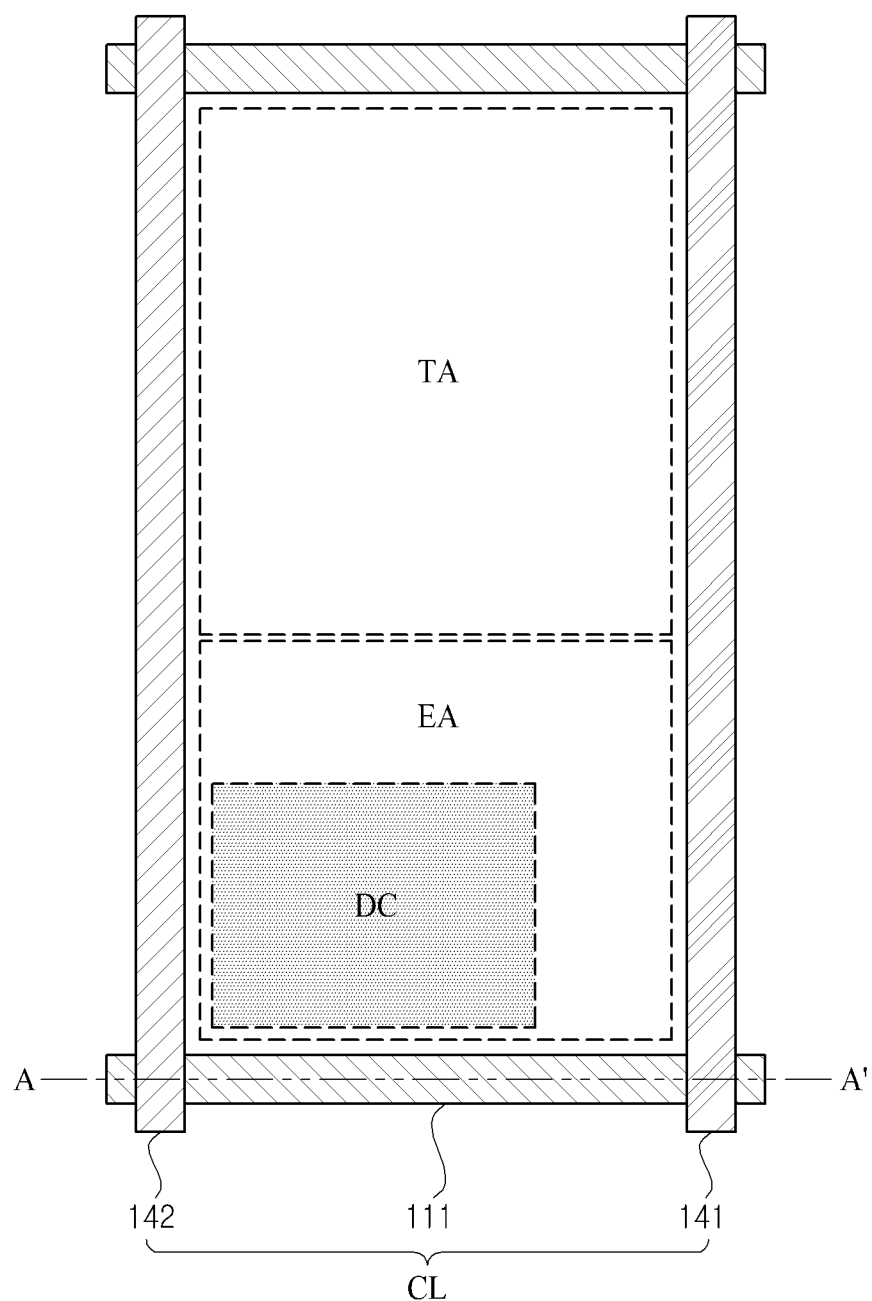
FIG. 2 is a plane view illustrating one pixel of an organic light emitting display device according to another embodiment of the present disclosure.

FIG. 2 is a plane view illustrating one pixel of an organic light emitting display device according to another embodiment of the present disclosure, and illustrates a conductive line CL, which defines a pixel. FIG. 2 does not separately illustrate an anti-reflective layer 120 arranged on the conductive line CL. But an illustration of an anti-reflective layer 120 arranged on the conductive line CL is provided instead in the cross-sectional views of FIGS. 3-5. The organic light emitting display device of FIG. 2 is a transparent organic light emitting display device.

As shown in FIG. 2, the organic light emitting display device according to another embodiment of the present disclosure includes the conductive line CL required for driving of the transparent organic light emitting display device. The conductive line CL defines the pixel that includes a transparent area TA and a light-emitting area EA.

The conductive line CL includes a gate line 111, a data line 141, and a power line 142. The gate line 111 and the data line 141 define the pixel by crossing each other. The data line 141 and the power line 142 may be arranged at a pixel boundary per pixel, or may be arranged at the pixel boundary alternately per pixel.

A driving circuit DC is formed in an area overlapped with the light-emitting area EA in a direction opposite to a light-emitting direction. Since the driving circuit DC corresponds to an area on which a plurality of conductive portions 113 and 145 for driving are concentrated, much reflection may occur. The conductive portions 113 and 145 are shown in FIG. 5, and the conductive line CL further includes the conductive portions 113 and 145.

The conductive portions 113 and 145 which are elements required for the driving circuit DC may include a capacitor connected with the conductive line CL, a thin film transistor, and a connection line that connects a plurality elements including the capacitor and the thin film transistor with each other.

Since the conductive line CL is generally formed of a material having high reflectivity, for example, metal, the anti-reflective layer 120 may be arranged on the conductive line CL to prevent reflection from occurring. In case of the transparent organic light emitting display device, since a polarizing plate (not shown) applied to the organic light emitting display device to reflect external light cannot be used to improve transmittance of the transparent area TA, the anti-reflective layer 120 will necessarily be required to reflect external light.

Even in case of the transparent organic light emitting display device, the anti-reflective layer 120 may be arranged in a watching direction of the user, thereby improving visibility and contrast ratio. In other words, in case of the bottom emission type, the anti-reflective layer 120 may be arranged between the conductive line CL and a substrate 101. In case of the top emission type, the anti-reflective layer 120 may be arranged on the conductive line CL.

Figure 3:
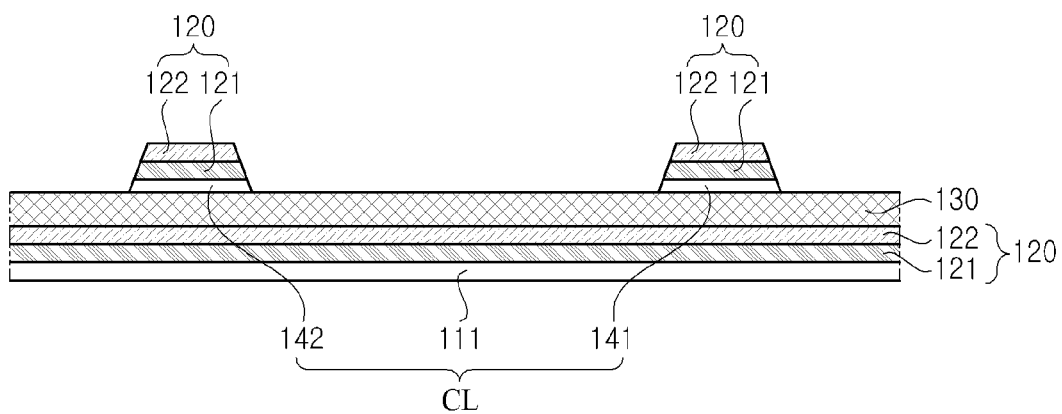
FIG. 3 is a cross-sectional view taken along line A-A' of FIG. 2.
Figure 4:
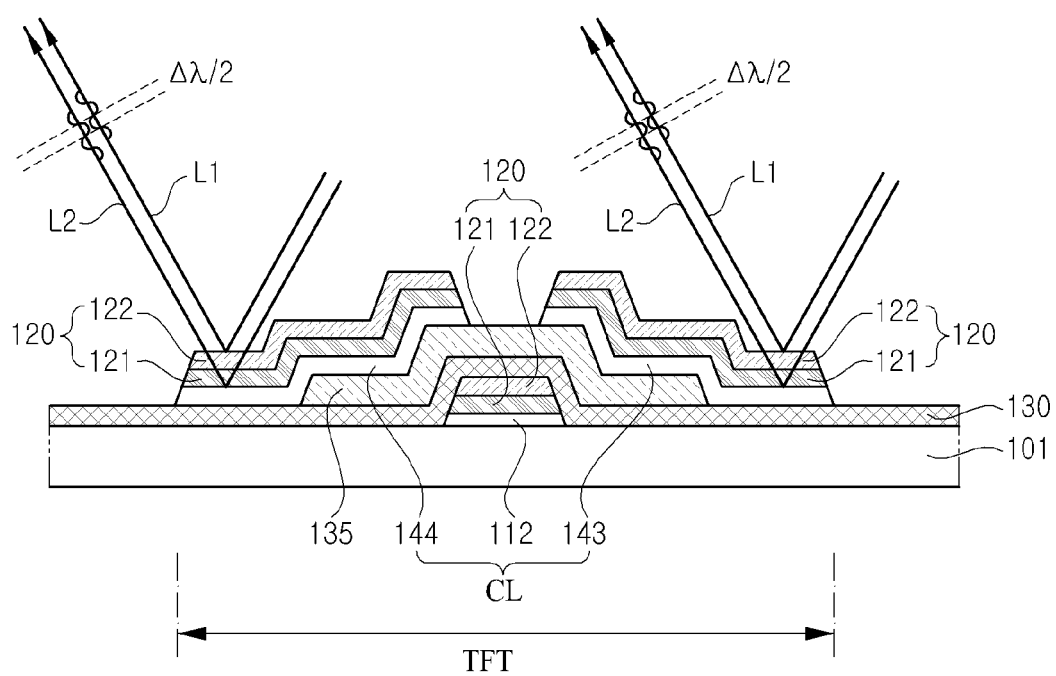
FIG. 4 is a cross-sectional view illustrating a thin film transistor that drives an organic light emitting display device.

FIGS. 3 to 5 illustrate that an anti-reflective layer 120 is arranged on a conductive line CL of an organic light emitting display device.

First of all, FIG. 3 is a cross-sectional view taken along line A-A' of FIG. 2. FIG. 3 may be the same as a cross-sectional view taken along line A-A' of FIG. 1.

As shown in FIG. 3, the organic light emitting display device according to one embodiment of the present disclosure includes the anti-reflective layer 120 arranged on the conductive line CL. The conductive line CL includes a gate line 111, a data line 141, and a power line 142. In FIG. 3, the gate line 111, the data line 141, and the power line 142 are collectively shown as the conductive line CL.

The anti-reflective layer 120 is arranged on the conductive line CL, and includes an intermediate layer 121 arranged on the conductive line CL and a semi-transparent layer 122 arranged on the intermediate layer 121. Alternatively, the anti-reflective layer 120 may have a double layer structure that the intermediate layer 121 and the semi-transparent layer 122 are repeatedly deposited alternately. In other words, one set where the intermediate layer 121 and the semi-transparent layer 122 are deposited may be repeated on the conductive line CL twice or more. Also, the conductive line CL is electrically connected with the semi-transparent layer 122 to prevent parasitic capacitance from being generated. In one or more embodiments, the semi-transparent layer 122 comprises a partially reflective material, whereas the intermediate layer 121 is composed of a substantially transparent material that has lower reflectivity than the semi-transparent layer 122.

External light incident on the conductive line CL disappears due to destructive interference between primary reflective light reflected from the semi-transparent layer 122 and secondary reflective light reflected from the conductive line CL by passing through the intermediate layer 121. The principle of the external light that disappears due to destructive interference will be described in more detail with reference to FIG. 4, FIG. 6A and FIG. 6B.

In more detail, the anti-reflective layer 120 is arranged on the gate line 111. The anti-reflective layer 120 includes the intermediate layer 121 arranged on the gate line 111, and the semi-transparent layer 122 arranged on the intermediate layer 121. A gate insulating layer 130 may be arranged on the gate line 111 to insulate the gate line 111 from the data line 141 and the power line 142.

The anti-reflective layer 120 is also arranged on the data line 141 and the power line 142. Although a single power line 142 is shown as an example in FIG. 3, in practice, the power line 142 may include multiple voltage lines such as a high potential voltage line Vdd, a low potential voltage line Vss, and/or a reference potential voltage line Vref.

In more detail, the anti-reflective layer 120 includes the intermediate layer 121 arranged on the data line 141 and the power line 142 and the semi-transparent layer 122 arranged on the intermediate layer 121. As described above, the anti-reflective layer 120 may be arranged on the conductive line CL to prevent reflection of external light from occurring due to the conductive line CL.

For reference, a high potential voltage of the high potential voltage line Vdd may be referred to as a drain voltage if the high potential voltage is transferred from a thin film transistor (TFT) drain electrode, or may be referred to as a positive voltage if the high potential voltage is a positive number greater than 0. Likewise, a low potential voltage of the low potential voltage line Vss means a voltage which is relatively lower than the high potential voltage, and may be referred to as a source voltage if the low potential voltage is transferred from a source electrode, or may be referred to as a negative voltage if the low potential voltage is a negative number smaller than 0.

The high potential voltage is transferred via the high potential voltage line Vdd to an anode electrode 161 (illustrated in FIG. 5), and the low potential voltage is transferred via the low potential voltage line Vss to a cathode electrode 163 (illustrated in FIG. 5). In some embodiments, as shown in FIG. 5, an organic light emitting layer 162 is formed between the high potential voltage line Vdd and the low potential voltage line Vss. Current flows in the organic light emitting layer 162 due to a voltage difference between the high potential voltage and the low potential voltage. As the current flows in the organic light emitting layer 162, exciton generated by combination of hole and electron is transited to a ground state, whereby light is emitted.

FIG. 4 is a cross-sectional view illustrating a thin film transistor (TFT) that drives an organic light emitting display device.

As shown in FIG. 4, the thin film transistor TFT includes a gate electrode 112, a source electrode 143, and a drain electrode 144. Gate electrode 112, source electrode 143, and drain electrode 144 are collectively shown as the conductive line CL.

The gate electrode 112 is extended from or electrically coupled to the gate line 111 (explained with reference to FIG. 3) and transfers a gate signal to a semiconductor layer 135. An anti-reflective layer 120 is arranged on the gate electrode 112 to prevent reflection of external light from occurring. In more detail, an intermediate layer 121 is arranged on the gate electrode 112, and a semi-transparent layer 122 is arranged on the intermediate layer 121.

The source electrode 143 and the drain electrode 144 are spaced apart from each other, and may be extended from or electrically coupled to the data line 141 or the power line 142, or may be arranged on the same layer as the data line 141 or the power line 142. Alternatively, the source electrode 143 and the drain electrode 144 may be formed at the same time regardless of the layer on which the source electrode 143 and the drain electrode 144 are formed. In FIG. 4, the source electrode 143 and the drain electrode 144 are arranged over the semiconductor layer 135 and the gate insulating layer 121, and although the source electrode 143 and the drain electrode 144 may not be formed on the same layer as the data line 141 or the power line 142, they may simultaneously be formed of the same material as that of the data line 141 or the power line 142.

Portion of the external light incident on the source electrode 143 or the drain electrode 144 is reflected from the semi-transparent layer 122 as primary reflective light L1. The remaining external light which is not reflected from the semi-transparent layer 122 but propagates through the semi-transparent layer 122 and the intermediate layer 121 is reflected from the source electrode 143 or the drain electrode 144 as secondary reflective light L2 after passing through the intermediate layer 121. As a phase difference between the primary reflective light L1 and the secondary reflective light L2 becomes 180 degrees or π radians, at which the optical path difference between the primary reflective light L1 and the secondary reflective light L2 becomes ½ of external light wavelength λ, peaks and valley of the optical wavefronts of reflected light L1, L2 spatially overlap with each other and the reflected light L1 and L2 disappears due to destructive interference between the optical wavefronts of reflected light L1 and L2. The thickness of the intermediate layer 121 of the anti-reflective layer 120 is adjusted appropriately such that the optical path difference between the primary reflective light L1 and the secondary reflective light L2 becomes ½ of external light wavelength λ, corresponding to a phase difference of 180 degrees or π radians.

In the driving circuit DC of the organic light emitting display device, the thin film transistor TFT is an important element that drives a pixel. Unlike a liquid crystal display (LCD), the organic light emitting display device requires at least two thin film transistors, wherein one of the two thin film transistors is a switching TFT and the other one is a driving TFT.

The switching TFT transfers a data signal, which is transferred through a source electrode (not shown) extended from the data line 141, to a drain electrode (not shown) in accordance with a gate signal transferred from the data electrode 112 extended from the gate line 111.

The driving TFT transfers the high potential voltage Vdd to the anode electrode 161 in accordance with the data signal transferred from the drain electrode (not shown) of the switching TFT. Accordingly, the thin film transistor shown in FIG. 5 may be the driving TFT.

In more detail, the gate electrode 112 of the driving TFT connected with the drain electrode (not shown) of the switching TFT transfers the high potential voltage Vdd, which is transferred from the source electrode 143 extended from the power line 142, to the anode electrode 161 in accordance with the data signal transferred from the switching TFT.

The anti-reflective layer 120 is arranged on the electrodes 112, 143 and 144 of the plurality of thin film transistors including the switching TFT and the driving TFT as described above, whereby reflection of external light may be prevented from occurring without a polarizing plate, and visibility and contrast ratio may be improved.

Although FIG. 4 illustrates a general bottom gate type thin film transistor TFT, various thin film transistors TFTs such as a top gate type TFT and a double gate type TFT may be applied to the present embodiments without limitation to FIG. 4.

Meanwhile, since the gate electrode 112 may transfer the gate signal to the semiconductor layer 135 in view of its function, the anti-reflective layer 120 arranged between the gate electrode 112 and the semiconductor layer 135 may delay transfer of the gate signal. Also, if the intermediate layer 121 is an insulating material, transfer of the gate signal to the semiconductor layer 135 may be delayed or cannot be performed, and may be delayed as capacitance occurs between the gate electrode 112 and the semi-transparent layer 122.

Since a problem may occur in driving as transfer of the gate signal is delayed due to various reasons as described above, the anti-reflective layer 120 may be formed of a conductive material to solve the problem in driving. For example, the intermediate layer 121 and the semi-transparent layer 122 may both be formed of an electrically conductive material.

For example, the semi-transparent layer 122 may be a thin metal that partially reflects external light, and the intermediate layer 121 may be a transparent material to transfer the external light, which has passed through the semi-transparent layer 122, to the conductive line CL. The intermediate layer 121 may be formed of a transparent conductive oxide (TCO) to conduct the semi-transparent layer 122 with the conductive line CL, or may be formed of a transparent insulating material and may have a structure that connects the semi-transparent layer 122 with the conductive line CL through a through hole TH (as illustrated in FIG. 6B). The structure of the semi-transparent layer 122 and the intermediate layer 121 will be described in detail with reference to FIGS. 6A and 6B.

FIG. 5 is a cross-sectional view illustrating a thin film transistor TFT and a conductive line CL that includes conductive portions 113 and 145.

Particularly, the conductive portions 113 and 145 in a driving circuit DC are exemplarily shown in FIG. 5, wherein the conductive portions may be formed at a side of the thin film transistor TFT simultaneously with the source electrode 143 or the drain electrode 144. Although the gate line 111 and the data line 141 are not shown in FIG. 5, the conductive portions 113 and 145 may be formed on the same layer as any one of the gate line 111, the data line 141 and the power line 142 or simultaneously with any one of the gate line 111, the data line 141 and the power line 142, or may be connected with any one of the conductive line CL.

The anti-reflective layer 120 is also arranged on the conductive portions 113 and 145. Since the conductive portions 113 and 145 are concentrated on the driving circuit DC, reflectivity of external light may be high but may be reduced by the anti-reflective layer 120. In addition, a gate pad (not shown) or a data pad (not shown) may be included in the conductive portions 113 and 145, and all areas having conductivity may be included in the conductive portions 113 and 145. A planarization layer 150 may be arranged above the conductive portions 113 and 145 by interposing an anode electrode 161, thereby planarizing the driving circuit DC and improving process reliability of the anode electrode 161, a cathode electrode 163, and an organic light emitting layer 162.

The anode electrode 161 is connected with the source electrode 143 or the drain electrode 144 of the thin film transistor TFT, and the cathode electrode 163 is connected with the power line 142. In more detail, the cathode electrode 163 may be connected with a low potential voltage line Vss of the power line 142.

The conductive portion 113 may be formed on the same layer as the gate line 111 simultaneously with the gate line 111 to constitute the driving circuit DC, and the other conductive portion 145 may be formed on the same layer as the data line 141 or the power line 142 simultaneously with the data line 141 or the power line 142 to constitute the driving circuit DC. For example, FIG. 5 illustrates that the conductive portion is arranged on the same layer as the source electrode 143 or the drain electrode 144, the source electrode 143 and the drain electrode 144 may be formed on the same layer as the data line 141 or the power line 142 simultaneously with the data line 141 or the power line 142.

The anode electrode 161 and the cathode electrode 163, which are shown in FIG. 5, may be included in the conductive line CL, and occupy the greatest area in a pixel but the anti-reflective layer 120 may be formed or not be formed above the anode electrode 161 and the cathode electrode 163 due to the problem in driving. Since the anode electrode 161 is formed of a transparent conductive material, reflectivity of external light is not high relatively. In case of the cathode electrode 163, transparency of the cathode electrode 163 should be enhanced as much as possible to minimize luminance deterioration of emitted light due to the top emission type, and the anti-reflective layer 120 may be formed on the cathode electrode 163 within the range that does not deteriorate or affect transparency of the cathode electrode 163.

Meanwhile, the organic light emitting layer 162 is arranged between the anode electrode 161 and the cathode electrode 163, and exciton formed in the organic light emitting layer 162 by combination of hole transferred from the anode electrode 161 and electron transferred from the cathode electrode 163 is transited from an excited state to a ground state, whereby light is emitted.

Figure 6A:
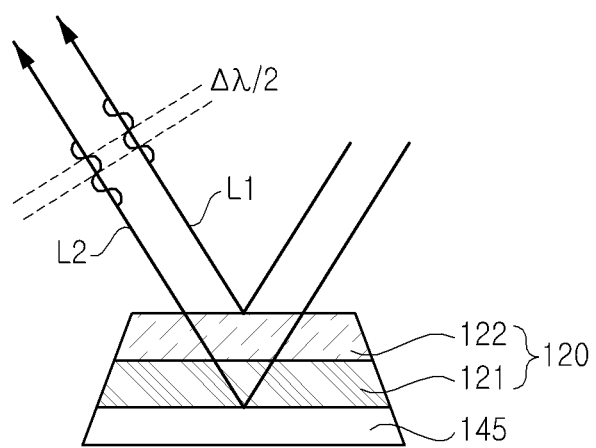
FIGS. 6A and 6B are cross-sectional views illustrating an anti-reflective layer of the present disclosure.
Figure 6B:
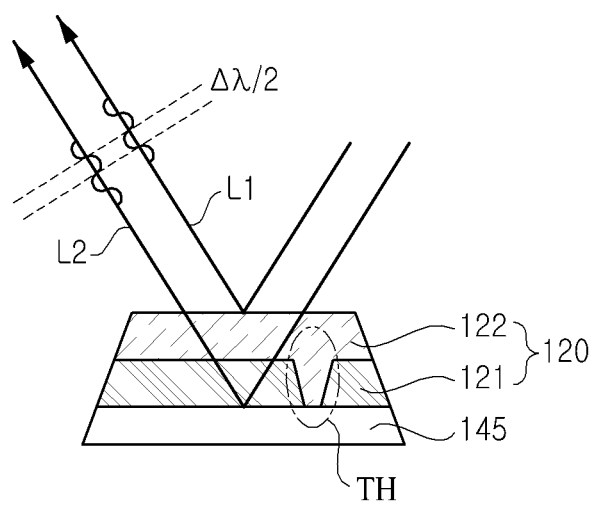

FIGS. 6A and 6B are cross-sectional views illustrating an anti-reflective layer according to one or more embodiments. A conductive portion 145 is exemplarily shown as a conductive line CL.

FIG. 6A illustrates an embodiment that an intermediate layer 121 of an anti-reflective layer 120 is a conductive material. For example, the intermediate layer 121 may include a transparent conductive oxide (TCO) through which light may pass. In the same manner as the principle of the incident external light that disappears due to destructive interference in the thin film transistor TFT in FIG. 4, in FIG. 6A, incident external light is reflected from the semi-transparent layer 122 of the anti-reflective layer 120 as primary reflective light L1, and the other external light which is not reflected passes through the intermediate layer 121 and then is reflected from the conductive portion 145 as secondary reflective light L2. In this instance, the secondary reflective light L2 varies in phase in relation with the primary reflective light L1 while passing through the intermediate layer 121, and if the phase difference between the primary reflective light L1 and the secondary reflective light L2 becomes π radians or 180 degrees, corresponding to an optical path difference of λ/2 in accordance with the thickness of the intermediate layer 121, the external light disappears due to destruction interference.

FIG. 6B illustrates an embodiment that a through hole TH is formed in the intermediate layer 121 of the anti-reflective layer 120 and the semi-transparent layer 122 is directly connected with the conductive portion 145 through the through hole TH. Accordingly, the intermediate layer 121 may include an insulating material having transparency which is relatively high. The external light incident on the anti-reflective layer 120 is reflected from the semi-transparent layer 122 of the anti-reflective layer 120 as primary reflective light L1, and the other external light which is not reflected passes through the intermediate layer 121 and then is reflected from the conductive portion 145 as secondary reflective light L2. If the optical path difference between the primary reflective light L1 and the secondary reflective light L2 becomes λ/2 in accordance with the thickness of the intermediate layer 121, the external light disappears due to destruction interference. Since the intermediate layer 121 does not exist in the through hole TH, the phase difference between the primary reflective light L1 and the secondary reflective light L2 cannot be generated. Accordingly, an area of the through hole TH may be minimized to minimize an area where the external light does not disappear due to destructive interference, whereby anti-reflective effect of the external light may be maximized.

Although not shown in FIG. 6B, as another embodiment, the through hole TH may not be formed, and the intermediate layer 121 may be formed to have a width narrower than that of the conductive line CL, whereby the semi-transparent layer 122 may directly be connected with the edge of the conductive line CL. The semi-transparent layer 122 may be connected with the conductive line CL at the edge of one side or both sides.

As described above, as the conductive line CL is conducted with the semi-transparent layer 122 of the anti-reflective layer 120, parasitic capacitance is not generated, and visibility and contrast ratio may be improved by preventing reflection of the external light from occurring while preventing the problem such as delay of signal transfer.

As the anti-reflective layer 120 is formed on the conductive line CL having reflectivity which is relatively high as described above, reflection of the external light may efficiently be prevented from occurring, whereby a polarizing plate which is expensive and deteriorates luminance may be omitted, and luminance may be improved. Moreover, in case of the transparent organic light emitting display device, since the polarizing plate should necessarily be omitted, application of the anti-reflective structure of external light such as the anti-reflective layer 120 is necessarily required, whereby the anti-reflective layer 120 of the present disclosure may effectively be applied to the transparent organic light emitting display device.

According to embodiments of the present disclosure, the following advantages may be obtained.

The anti-reflective is arranged on the conductive line, whereby reflection of external light may be prevented from occurring.

Also, according to the present disclosure, reflection of external light may be prevented from occurring, whereby visibility and contrast ratio of the organic light emitting display device may be improved.

Also, according to the present disclosure, the anti-reflective layer is arranged to prevent reflection of external light from occurring, whereby a polarizing plate which is expensive may be removed, and the manufacturing cost may be saved.

Also, according to the present disclosure, the anti-reflective layer is arranged to prevent reflection of external light from occurring, whereby visibility and contrast ratio may be improved effectively even in case of the transparent organic light emitting display device.

It will be apparent to those skilled in the art to which the present disclosure pertains that various modifications and variations can be made in the embodiments without departing from the spirit or scope of the disclosure.

Thus, it is to be understood that the above embodiments are to be considered in all respects as illustrative and not restrictive. Thus, it is intended that the present invention covers the modifications and variations of this disclosure provided they come within the scope of the appended claims and their equivalents.

What is claimed is:

1. An organic light emitting display device comprising:
a substrate that includes a plurality of pixel regions;
a plurality of conductive lines arranged on the substrate that define peripheries of the plurality of pixel regions, the plurality of conductive lines including a gate line that delivers a gate signal to a pixel region, a data line that delivers a data signal to the pixel region, and a power line that delivers a power signal to the pixel region; and
a first anti-reflective layer arranged on the data line, the first anti-reflective layer including an intermediate layer arranged directly on the data line and a semi-transparent layer arranged on the intermediate layer of the first anti-reflective layer, and
a second anti-reflective layer arranged on the power line, the second anti-reflective layer including an intermediate layer arranged directly on the power line and a semi-transparent layer arranged on the intermediate layer of the second anti-reflective layer;
wherein the intermediate layer arranged directly on the data line or the intermediate layer arranged directly on the power line is composed of an insulating material, and a through hole is arranged in the intermediate layer arranged directly on the data line to electrically connect the data line with the semi-transparent layer included in the first anti-reflective layer that is arranged on the data line, and a through hole is arranged in the intermediate layer arranged directly on the power line to electrically connect the power line with the semi-transparent layer included in the second anti-reflective layer that is arranged on the power line.

2. The organic light emitting display device of claim 1, wherein each pixel region of the plurality of pixel regions includes a transparent area.

3. The organic light emitting display device of claim 1, wherein the intermediate layer formed on the data line or on the power line is a conductive material, and electrically connects the respective semi-transparent layer arranged on the intermediate layer with the data line or the power line.

4. The organic light emitting display device of claim 1, wherein an optical path difference between a first portion of external incident light reflected from the data line or power line and a second portion of the external incident light reflected from either the semi-transparent layer arranged on the intermediate layer formed over the data line or from the semi-transparent layer arranged on the intermediate layer formed over the power line is λ/2, where λ is a wavelength of the external incident light.

5. The organic light emitting display device of claim 1, wherein each pixel region of the plurality of pixel regions comprises a thin film transistor, and the plurality of conductive lines further include a gate electrode for each thin film transistor extended from the gate line, a source electrode for each thin film transistor extended from the data line, and a drain electrode spaced apart from the source electrode.

6. The organic light emitting display device of claim 5, wherein the plurality of conductive lines further include an anode electrode connected with the source electrode or the drain electrode of each thin film transistor, and a cathode electrode connected with the power line.

7. The organic light emitting display device of claim 6, further comprising an organic light emitting layer arranged between the anode electrode and the cathode electrode.

8. The organic light emitting display device of claim 1, wherein the plurality of conductive lines further include a conductive portion connected with any one of the gate line, the data line and the power line.

9. The organic light emitting display device of claim 1, wherein a third anti-reflective layer is arranged on the gate line, the third anti-reflective layer formed over the gate line comprising a respective intermediate layer formed directly over the gate line and a respective semi-transparent layer formed over the respective intermediate layer, and the gate line is electrically connected with the respective semi-transparent layer included in the third anti-reflective layer that is arranged on the gate line.

\* \* \* \* \*